(12) United States Patent
Chen et al.

(10) Patent No.: US 11,675,961 B2
(45) Date of Patent: *Jun. 13, 2023

(54) ENGINEERING CHANGE ORDER CELL STRUCTURE HAVING ALWAYS-ON TRANSISTOR

(71) Applicant: TAIWAN SEMICONDUCTOR MANUFACTURING COMPANY, LTD., Hsinchu (TW)

(72) Inventors: Shun Li Chen, Hsinchu (TW); Li-Chun Tien, Hsinchu (TW); Ting Yu Chen, Hsinchu (TW); Wei-Ling Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/670,370

(22) Filed: Feb. 11, 2022

(65) Prior Publication Data

US 2022/0164518 A1 May 26, 2022

Related U.S. Application Data

(63) Continuation of application No. 17/081,438, filed on Oct. 27, 2020, now Pat. No. 11,275,885, which is a
(Continued)

(51) Int. Cl.
*G06F 30/398* (2020.01)
*G06F 30/392* (2020.01)
(Continued)

(52) U.S. Cl.
CPC ............. *G06F 30/398* (2020.01); *G03F 1/36* (2013.01); *G06F 30/392* (2020.01);
(Continued)

(58) Field of Classification Search
CPC .... G06F 30/398; G06F 30/392; G06F 30/394; G06F 30/3947; G06F 30/3953;
(Continued)

(56) References Cited

U.S. PATENT DOCUMENTS

| 4,935,790 A | 6/1990 | Cappelletti et al. |
| 5,656,967 A | 8/1997 | Casper et al. |

(Continued)

*Primary Examiner* — Phallaka Kik
(74) *Attorney, Agent, or Firm* — Hauptman Ham, LLP

(57) ABSTRACT

A semiconductor cell structure includes four pairs of conductive segments, a first gate-strip, and a second gate-strip. A first conductive segment is configured to have a first supply voltage, and a second conductive segment is configured to have a second supply voltage. Each of the first gate-strip and the second gate-strip intersects an active zone over a channel region of a transistor. The first gate-strip is conductively connected to the second conductive segment. The semiconductor cell structure also includes a first dummy gate-strip and a second dummy gate-strip. The first dummy gate-strip separates from the first gate-strip by one CPP. The second dummy gate-strip separates from the second gate-strip by one CPP. The first gate-strip and the second gate-strip are separated from each other by two CPPs. The dummy gate-strip and the second dummy gate-strip are separated from each other by four CPPs.

20 Claims, 12 Drawing Sheets

Related U.S. Application Data continuation of application No. 16/546,973, filed on Aug. 21, 2019, now Pat. No. 10,846,458.

(60) Provisional application No. 62/724,855, filed on Aug. 30, 2018.

(51) Int. Cl.

| | | |
|---|---|---|
| *G06F 30/394* | (2020.01) | |
| *G06F 30/3947* | (2020.01) | |
| *G06F 30/3953* | (2020.01) | |
| *G03F 1/36* | (2012.01) | |
| *H01L 21/70* | (2006.01) | |
| *H01L 25/00* | (2006.01) | |
| *H03K 19/00* | (2006.01) | |

(52) U.S. Cl.
CPC ........ *G06F 30/394* (2020.01); *G06F 30/3947* (2020.01); *G06F 30/3953* (2020.01); *H01L 21/70* (2013.01); *H01L 25/00* (2013.01); *H03K 19/00* (2013.01)

(58) Field of Classification Search
CPC . G03F 1/36; H01L 25/00; H01L 21/70; H01L 21/66; H03K 19/00
USPC .......... 716/122, 129, 130, 102; 326/47, 101, 326/102, 103; 257/499, 565, 798
See application file for complete search history.

(56) References Cited

U.S. PATENT DOCUMENTS

| | | |
|---|---|---|
| 6,236,258 B1 | 5/2001 | Hoenigschmid et al. |
| RE37,308 E | 8/2001 | Cappelletti et al. |
| 6,642,555 B1 | 11/2003 | Ishida |
| 7,260,442 B2 | 8/2007 | Hwang et al. |
| 7,528,455 B2 | 5/2009 | Ahn |
| 9,256,709 B2 | 2/2016 | Yu et al. |
| 9,412,800 B2 | 8/2016 | Kim |
| 10,846,458 B2 | 11/2020 | Chen et al. |
| 11,164,863 B2* | 11/2021 | Do ........................ H01L 27/092 |
| 11,239,355 B2* | 2/2022 | Naito .................. H01L 27/0727 |
| 11,275,885 B2* | 3/2022 | Chen .................... G06F 30/398 |
| 2007/0152244 A1 | 7/2007 | Ahn |
| 2007/0152281 A1 | 7/2007 | Ahn |
| 2009/0315079 A1 | 12/2009 | Tien et al. |
| 2014/0040838 A1 | 2/2014 | Liu et al. |
| 2015/0214260 A1 | 7/2015 | Inui |
| 2015/0278429 A1 | 10/2015 | Chang |
| 2016/0284705 A1 | 9/2016 | Chung |
| 2018/0182766 A1 | 6/2018 | Huang et al. |
| 2020/0019672 A1 | 1/2020 | Peng et al. |
| 2020/0035819 A1 | 1/2020 | Naito |
| 2020/0074041 A1* | 3/2020 | Chen .................... G06F 30/394 |
| 2020/0126901 A1 | 4/2020 | Chen et al. |
| 2021/0036041 A1 | 2/2021 | Miyamoto et al. |
| 2021/0089700 A1 | 3/2021 | Lu et al. |
| 2022/0246602 A1* | 8/2022 | Yang ................... H01L 27/0207 |

* cited by examiner

ENGINEERING CHANGE ORDER CELL STRUCTURE HAVING ALWAYS-ON TRANSISTOR

PRIORITY CLAIM

The present application is a continuation of U.S. application Ser. No. 17/081,438, filed Oct. 27, 2020, which is a continuation of U.S. application Ser. No. 16/546,973, filed Aug. 21, 2019, now U.S. Pat. No. 10,846,458, issued Nov. 24, 2020, which claims the priority of U.S. Provisional Application No. 62/724,855, filed Aug. 30, 2018, which is incorporated herein by reference in its entirety.

BACKGROUND

The recent trend in miniaturizing integrated circuits (ICs) has resulted in smaller devices which consume less power yet provide more functionality at higher speeds. The miniaturization process has also resulted in more strict restriction on the layout design of the IC circuits. During the layout design of the IC circuits, functional or physical cells are often placed in a circuit layout and routed to form functional circuits. In addition to normally connected cells for forming functional circuits, the layout design of the IC circuits often include engineering change order (ECO) cells distributed in the layout plan. The ECO cells are not functionally connected to the normally functioning electronic components according to the original circuit design of the IC. Some ECO cells may have implemented functions that can be used later in design modifications when the ECO cells are connected to the normally functioning electronic components. Some ECO cells may have unconnected transistors that are connected later to perform circuit functions in design modifications. Even if ECO cells are not participating in the normal functions of the IC, the ECO cells are still subjected to design rule restrictions and design validation check.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
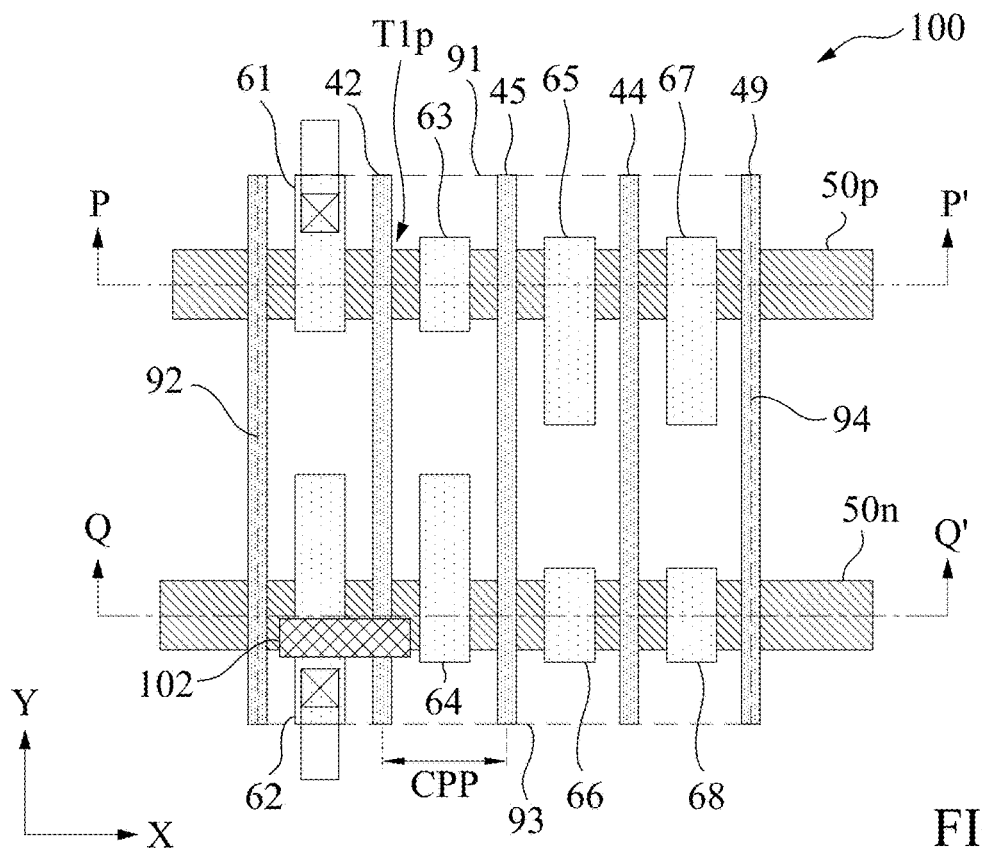
FIGS. 1A-1B are schematic diagrams of a layout design of a semiconductor cell structure, in accordance with some embodiments.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An engineering change order (ECO) cell structure generally includes a p-type active zone and an n-type active zone forming two parallel active zones extending in a horizontal direction. The ECO cell structure generally includes multiple p-type transistors in the p-type active zone and n-type transistors in n-type active zone. During initial design, the p-type transistors and the n-type transistors in an ECO cell structure are not sufficiently connected to become part of a normal functional circuit. For example, in some embodiments, the connections between the p-type transistors and the n-type transistors in the ECO cell are not sufficient to form a functional gate cell or a physical cell. In some embodiments, there are insufficient connections between an ECO cell and other normal functional circuit so that the ECO cell is not a functional part of other normal functional circuit. During design modifications, the connections between the p-type transistors and the n-type transistors in some of the ECO cells are modified, and some ECO cells become functional parts of other normal functional circuit.

An integrated circuit generally include multiple horizontal routing lines in a first metal layer overlies an interlayer dielectric layer covering the p-type transistors and the n-type transistors in an ECO cell. Some of the multiple horizontal routing lines over an ECO cell are unusable for inter-cell routings. It is generally desirable to minimize the number of the unusable horizontal routing lines over an ECO cell. Additionally, an integrated circuit generally also include multiple vertical routing lines in a second metal layer above the first metal layer. In some embodiments, when a predetermined number of the vertical routing lines passing over an ECO cell within two vertical boundaries of the ECO cell are reserved for the power grid lines, it is generally desirable to minimize the cell width of the ECO cell.

Figure 1B:
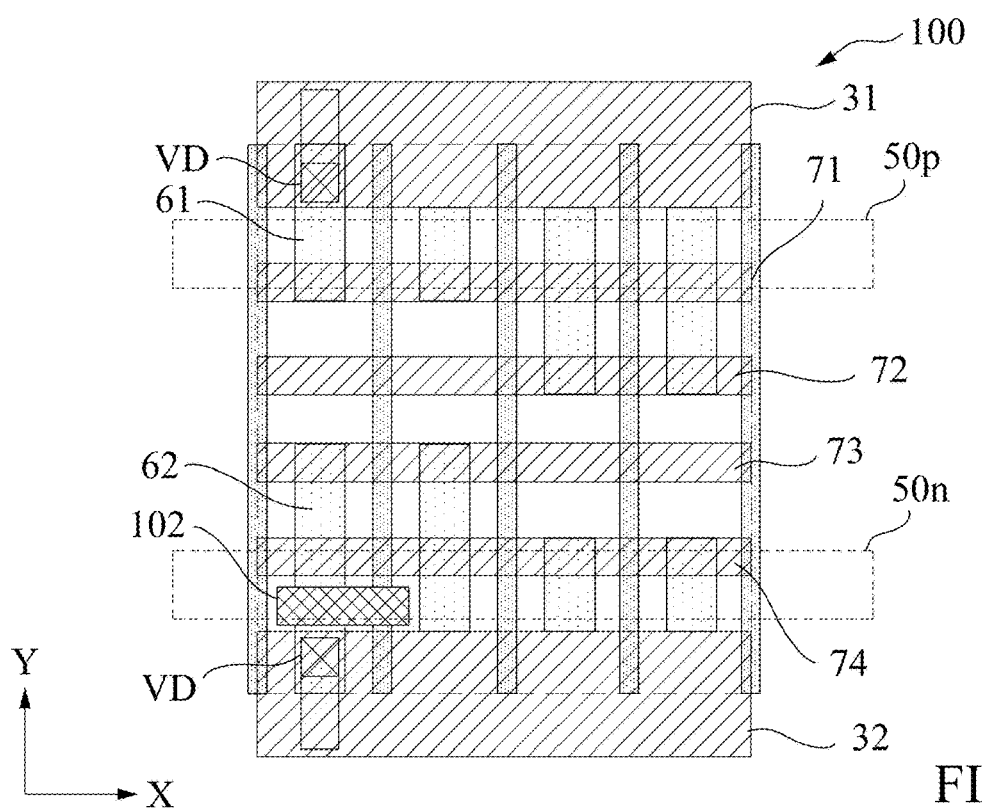

FIGS. 1A-1B are schematic diagrams of a layout design of a semiconductor cell structure 100, in accordance with some embodiments. In FIG. 1A, elements below the first metal layer for routing lines are shown in corresponding layout patterns. The elements in FIG. 1A include active zones, gate-strips, conductive segments and other conductive elements in the middle layer that is between the first metal layer and the substrate. In FIG. 1B, routing lines and power rails in the first metal layer are shown in corresponding layout patterns and superimposed on the layout patterns in FIG. 1A while the active zones in FIG. 1A are only shown by boxes in dashed lines to indicated the boundaries.

In FIGS. 1A-1B, the semiconductor cell structure 100 includes a p-type active zone 50*p* and an n-type active zone 50*n* forming two parallel active zones extending in the X-direction. The semiconductor cell structure 100 includes a first gate-strip 42 and a second gate-strip 44 both extending in the Y-direction that is perpendicular to the X-direction. Each of the first gate-strip 42 and the second gate-strip 44 intersects both the p-type active zone 50*p* and the n-type active zone 50*n*. The semiconductor cell structure 100 includes four pairs of conductive segments extending in the Y-direction. The four pairs of conductive segments include a first pair of conductive segments (e.g., 61 and 63) on each side of the first gate-strip 42, a second pair of conductive segments (e.g., 62 and 64) on each side of the first gate-strip 42, a third pair of conductive segments (e.g., 65 and 67) on each side of the second gate-strip 44, and a fourth pair of conductive segments (e.g., 66 and 68) on each side of the second gate-strip 44. The first pair of conductive segments (e.g., 61 and 63) and the third pair of conductive segments (e.g., 65 and 67) intersect the p-type active zone 50*p*. The second pair of conductive segments (e.g., 62 and 64) and the fourth pair of conductive segments (e.g., 66 and 68) intersect the n-type active zone 50*n*. The semiconductor cell structure 100 includes a conducting element 102 that conductively connects the first gate-strip 42 with the conductive segment 62.

In FIG. 1B, the semiconductor cell structure 100 includes power rails (e.g., 31 and 32) and horizontal routing lines (e.g., 71-74) extending in the X-direction. In some embodiments, both the power rails (e.g., 31 and 32) and the horizontal routing lines (e.g., 71-74) are fabricated in a first metal layer M0. In some embodiments, the first metal layer M0 overlies an interlayer dielectric (ILD) layer. In FIG. 1B, each of the horizontal routing lines (e.g., 71-74) intersects one or more conductive segments in the four pairs of conductive segments (e.g., 61-68) over one or more corresponding intersections without making direct conductive contact with any of the conductive segments at the intersections. For example, the horizontal routing line 71 intersects four conductive segments (e.g., 61, 63, 65, and 67) without making direct conductive contact with the four conductive segments that are underneath, because the horizontal routing line 71 is conductively isolated from the four conductive segments (e.g., 61, 63, 65, and 67) by the interlayer dielectric layer underneath the first metal layer M0. Similarly, the horizontal routing line 72 intersects two conductive segments (e.g., 65 and 67) without making conductive contact with the two conductive segments through direct conductive connections, such as vias, at the intersections. The horizontal routing line 73 intersects two conductive segments (e.g., 62 and 64) without making conductive contact with the two conductive segments through direct conductive connections at the intersections. The horizontal routing line 74 intersects four conductive segments (e.g., 62, 64, 66, and 68) without making conductive contact with the underneath conductive segments through direct conductive connections at the intersections.

In FIG. 1A and FIG. 1B, the semiconductor cell structure 100 is within a rectangular area defined by two horizontal boundaries (e.g., 91 and 93) and two vertical boundaries (e.g., 92 and 94). Two dummy gate-strips 41 and 49, extending in the Y-direction, are correspondingly located at the vertical boundaries 92 and 94. A third dummy gate-strip 45, extending in the Y-direction, is located at a middle line having a same pitch distance to each of the two vertical boundaries 92 and 94. Each of the dummy gate-strips (e.g., 41, 49, and 45) intersects both the p-type active zone 50*p* and the n-type active zone 50*n*.

Figure 2A:
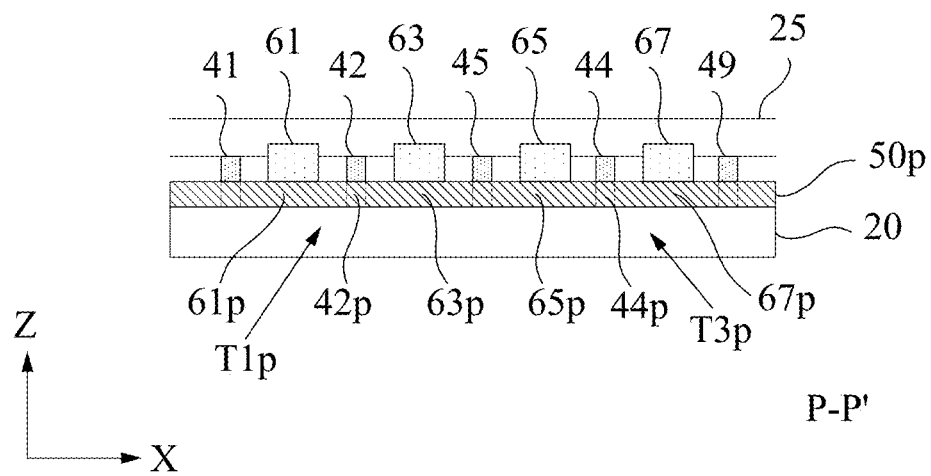
FIGS. 2A-2B are cross-sectional views of the semiconductor cell structure in FIG. 1A along cutting plane P-P' and cutting plane Q-Q', in accordance with some embodiments.
Figure 2B:
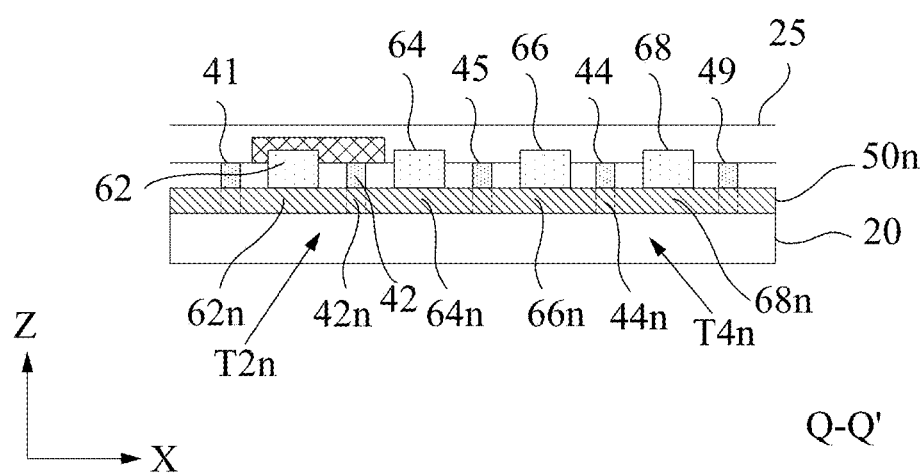

FIGS. 2A-2B are cross-sectional views of the semiconductor cell structure 100 in FIG. 1A along cutting plane P-P' and cutting plane Q-Q', in accordance with some embodiments. In FIG. 2A, the first gate-strip 42 intersects the p-type active zone 50*p* over a channel region 42*p*, and the second gate-strip 44 intersects over a channel region 44*p*. The first pair of conductive segments (e.g., 61 and 63) intersects the p-type active zone 50*p* over two corresponding active regions (e.g., 61*p* and 63*p*) adjoining the channel region 42*p* of a transistor T1*p*. The third pair of conductive segments (e.g., 65 and 67) intersects the p-type active zone 50*p* over two corresponding active regions (e.g., 65*p* and 67*p*) adjoining the channel region 44*p* of a transistor T3*p*. The conductive segments (e.g., 61, 63, 65, and 67), the gate strips (e.g., 42 and 44), and the dummy gate-strips (e.g., 41, 49, and 45) are all covered by the ILD layer underneath the first metal layer M0. The top surface 25 of the ILD layer is shown in the figure.

In FIG. 2B, the first gate-strip 42 intersects the n-type active zone 50*n* over a channel region 42*n*, and the second gate-strip 44 intersects over a channel region 44*n*. The second pair of conductive segments (e.g., 62 and 64) intersects the n-type active zone 50*n* over two corresponding active regions (e.g., 62*n* and 64*n*) adjoining the channel region 42*n* of a transistor T2*n*. The fourth pair of conductive segments (e.g., 66 and 68) intersects the n-type active zone 50*n* over two corresponding active regions (e.g., 66*n* and 68*n*) adjoining the channel region 44*n* of a transistor T4*n*. In FIG. 2B, the conducting element 102 conductively connects the first gate-strip 42 with the conductive segment 62. The conductive segments (e.g., 62, 64, 66, and 68), the gate strips (e.g., 42 and 44), and the dummy gate-strips (e.g., 41, 49, and 45), and the conducting element 102 are all covered by the ILD layer underneath the first metal layer M0. The top surface 25 of the ILD layer is shown in the figure.

In FIG. 1B, the power rail 31 is held at an upper supply voltage VDD, and the power rail 32 is held at a lower supply voltage VSS. The conductive segment 61 is conductively connected to the power rail 31 through one of the vias VD. The conductive segment 62 is conductively connected to the power rail 32 through another one of the vias VD. When the first gate-strip 42 is conductively connected to the conductive segment 62 through the conducting element 102, the gate of the transistor T1$p$ is conductively connected to the power rail 32, and the channel region 42$p$ of the transistor T1$p$ remains turned on by the lower supply voltage VSS applied to the gate of the transistor T1$p$.

Figure 3A:
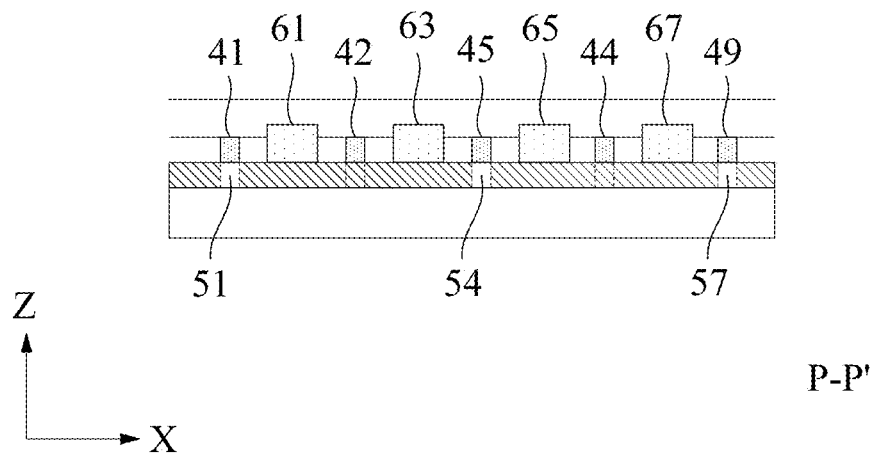
FIGS. 3A-3B are cross-sectional views of the semiconductor cell structure in FIG. 1A along cutting plane P-P' and cutting plane Q-Q', in accordance with some embodiments.
Figure 3B:
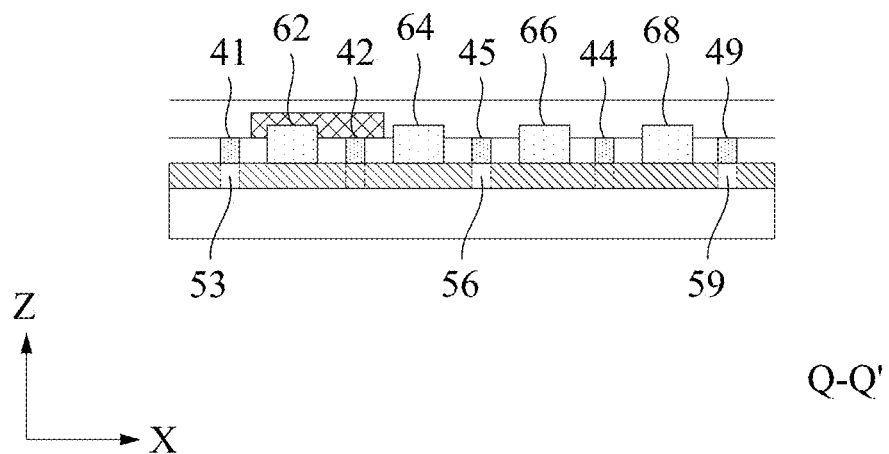

In some embodiments, the active zone 50$p$ and the active zone 50$n$ include isolation regions underneath the dummy gate-strips (e.g., 41, 49, and 45 in FIG. 1A). FIGS. 3A-3B are cross-sectional views of the semiconductor cell structure 100 in FIG. 1A along cutting plane P-P' and cutting plane Q-Q', in accordance with some embodiments. The cross-sectional views of the conductive segments (e.g., 61, 63, 65, and 67) and the gate strips (e.g., 42 and 44) as shown in FIG. 3A are identical to that in FIG. 2A. The cross-sectional views of the conductive segments (e.g., 62, 64, 66, and 68) and the gate strips (e.g., 42 and 44) as shown in FIG. 3B are identical to that in FIG. 2B. The dummy gate-strips in FIG. 3A and FIG. 3B; however, intersect with the active zones at intersections above isolation regions in the active zones. Specifically, the dummy gate-strips 41, 49, and 45 in FIG. 3A intersect with the active zone 50$p$ at intersections correspondingly above isolation regions 51, 54, and 57. The dummy gate-strips 41, 49, and 45 in FIG. 3B intersect with the active zone 50$n$ at intersections correspondingly above isolation regions 53, 56, and 59.

Figure 3C:
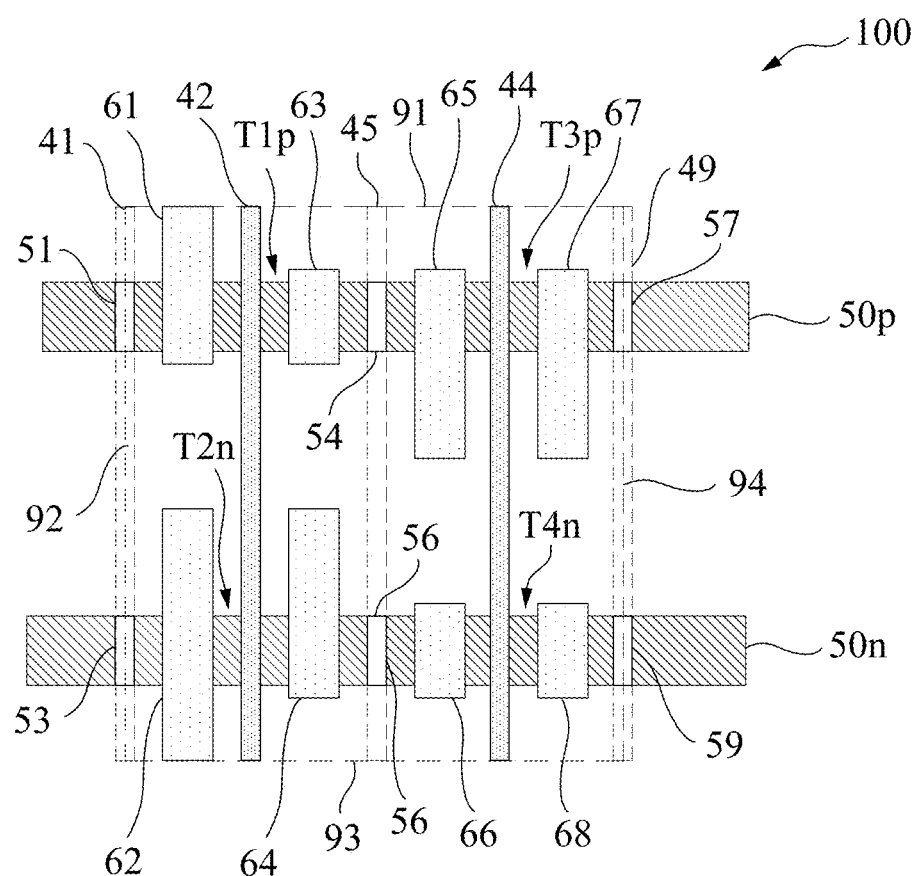
FIG. 3C is a plan view of the active zones and the isolation regions in FIGS. 3A-3B, in accordance with some embodiments.

FIG. 3C is a plan view of the active zones and the isolation regions in FIGS. 3A-3B, in accordance with some embodiments. The gate strips (e.g., 42 and 44) and the conductive segments (e.g., 61-68) intersecting the active zones (e.g., 50$p$ and 50$n$) are shown in FIG. 3C, along with the isolation regions (e.g., 51, 54, and 57) in the p-type active zone 50$p$ and the isolation regions (e.g., 53, 56, and 59) in the n-type active zone 50$n$. The dummy gate-strips 41, 49, and 45 overlying the isolation regions are shown in FIG. 3C as transparent strips surrounded by dash-line boundaries.

In some embodiments, the active zones (e.g., 50$p$ and 50$n$) are fabricated in the form of a continuous oxide diffusion (CNOD) zone which does not break at the boundary between two abutting cells for constructing a functional circuit. In some embodiments, the portion of the p-type active zone 50$p$ within the semiconductor cell structure 100 is conductively isolated in the active zone from other portions of the p-type active zone outside the semiconductor cell structure 100, by the isolation regions (e.g., 51 and 57) at the vertical boundaries and the dummy gate-strips (e.g., 41 and 49) above the isolation regions. Similarly, the portion of the n-type active zone 50$n$ within the semiconductor cell structure 100 is conductively isolated in the active zone from other portions of the n-type active zone outside the semiconductor cell structure 100, by the isolation regions (e.g., 53 and 59) at the vertical boundaries and the dummy gate-strips (e.g., 41 and 49) above the isolation regions. In some embodiments, the active region 63$p$ of transistor T1$p$ under the conductive segment 63 is conductively isolated in the active zone from the active region 65$p$ of transistor T3$p$ under the conductive segment 65, by the isolation region 54 and the dummy gate-strip 45 above the isolation region 54. The active region 64$n$ of transistor T2$n$ under the conductive segment 64 is conductively isolated in the active zone from the active region 66$n$ of transistor T4$n$ under the conductive segment 66, by the isolation region 56 and the dummy gate-strip 45 above the isolation region 56.

Figure 4A:
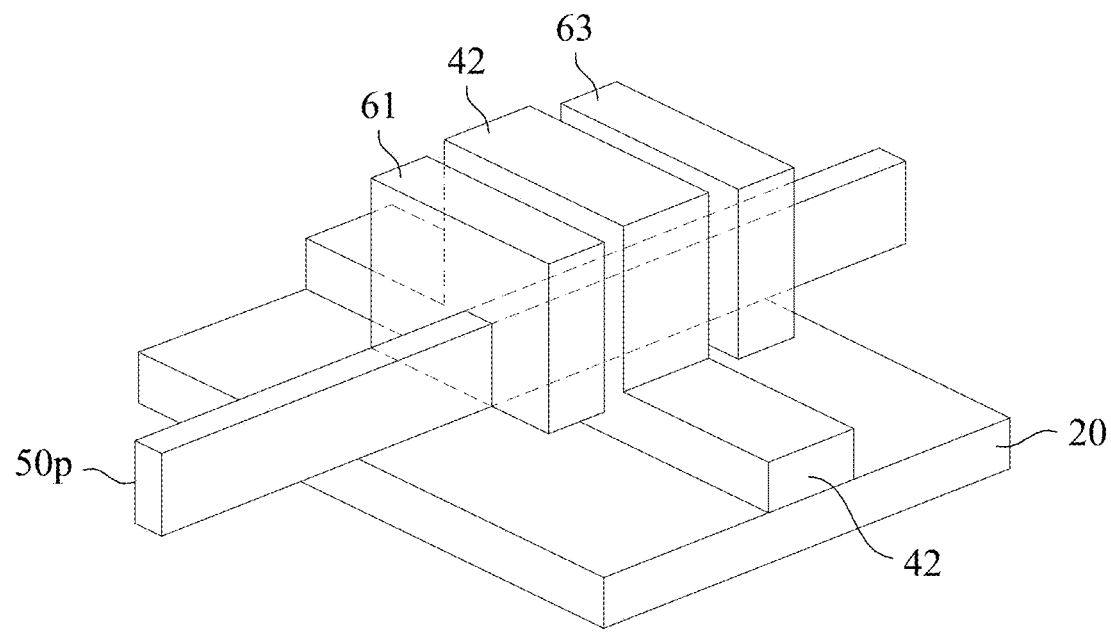
FIGS. 4A-4B are perspective views of the active zone in FIGS. 1A-1B having one or more fin structures under the gate-strips and the conductive segments, in accordance with some embodiments.
Figure 4B:
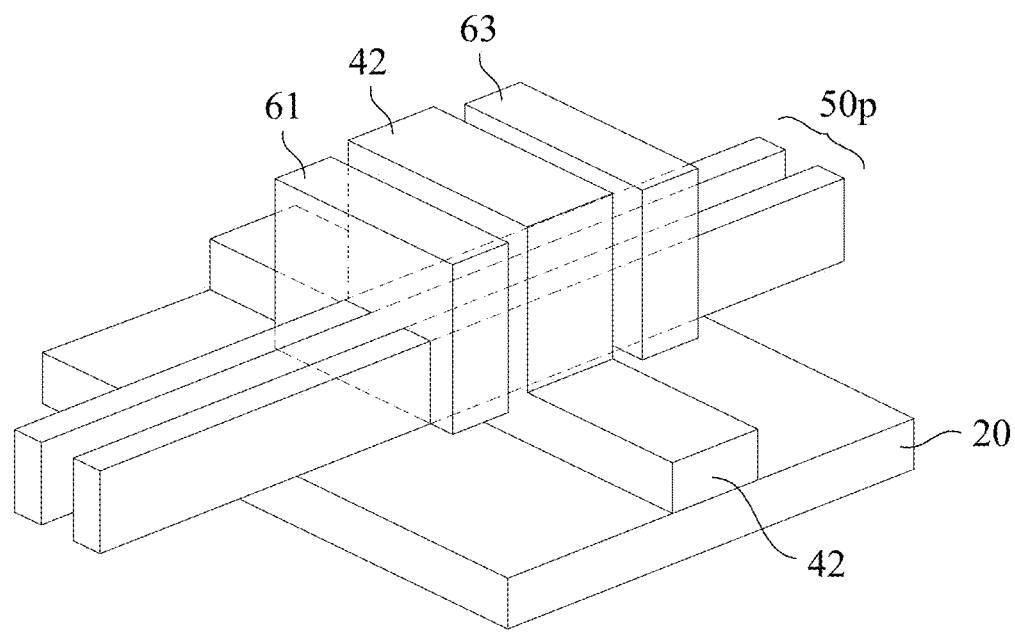

FIGS. 4A-4B are perspective views of the active zone (e.g., 50$p$ or 50$n$) in FIGS. 1A-1B having one or more fin structures under the gate-strips (e.g., 42) and the conductive segments (e.g., 61 and 63), in accordance with some embodiments. In FIG. 4A, one fin structure extending in the X-direction is fabricated for the active zone (e.g., 50$p$ or 50$n$), and the gate channel is formed between the gate-strip 42 and the fin structure. In FIG. 3B, two fin structures extending in the X-direction are fabricated for the active zone (e.g., 50$p$ or 50$n$), and the gate channel is formed between the gate-strip 42 and the two fin structures. In FIGS. 4A-4B, each of the two conductive segments (e.g., 61 and 63) conductively contacts one of the active regions, in the active zone (e.g., 50$p$ or 50$n$), on either side of the gate channel under the gate-strip 42, and forms one of the source connection or drain connection of the FinFET which has its gate connected to the gate-strip 42. In some embodiments, gate supporting structures other than the fin structure are fabricated for the active zone (e.g., 50$p$ or 50$n$), and other types of FETs (e.g., Gate-all-around FETs, Omega-gate FET, or Tri-gate FETs) are fabricated on the gate supporting structures in the active zone (e.g., 50$p$ or 50$n$).

Figure 5A:
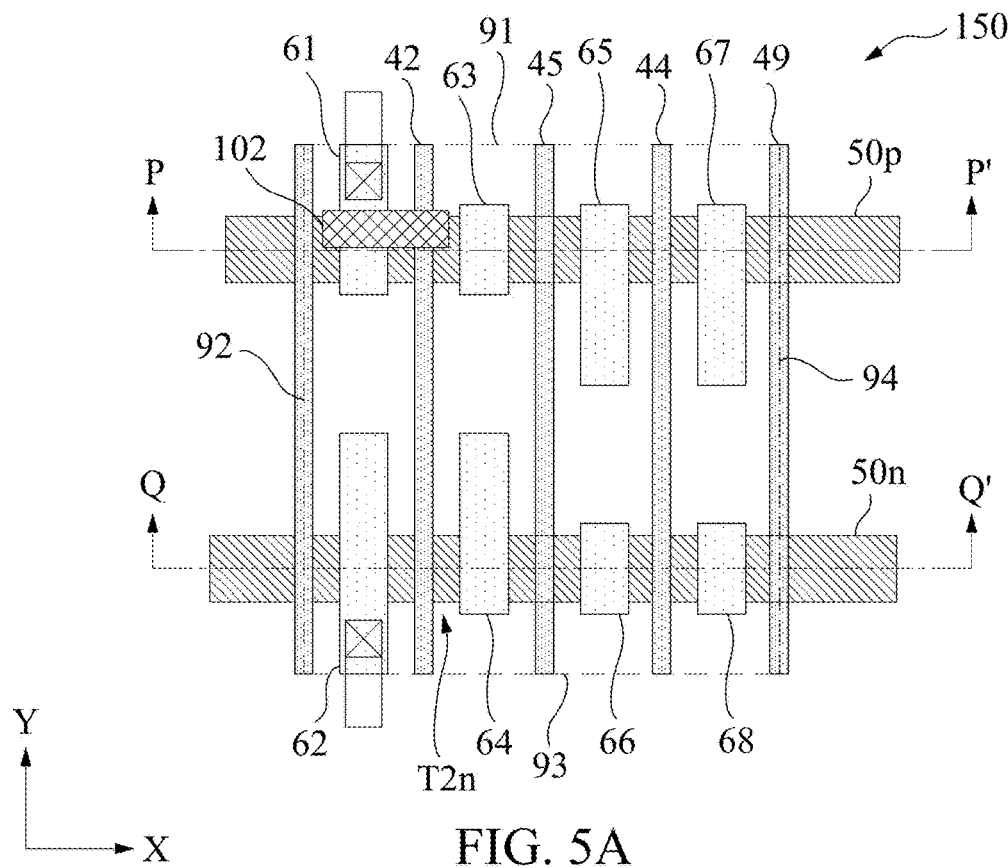
FIGS. 5A-5B are schematic diagrams of a layout design of a semiconductor cell structure that is a modification of the semiconductor cell structure in FIGS. 1A-1B, in accordance with some embodiments.
Figure 5B:
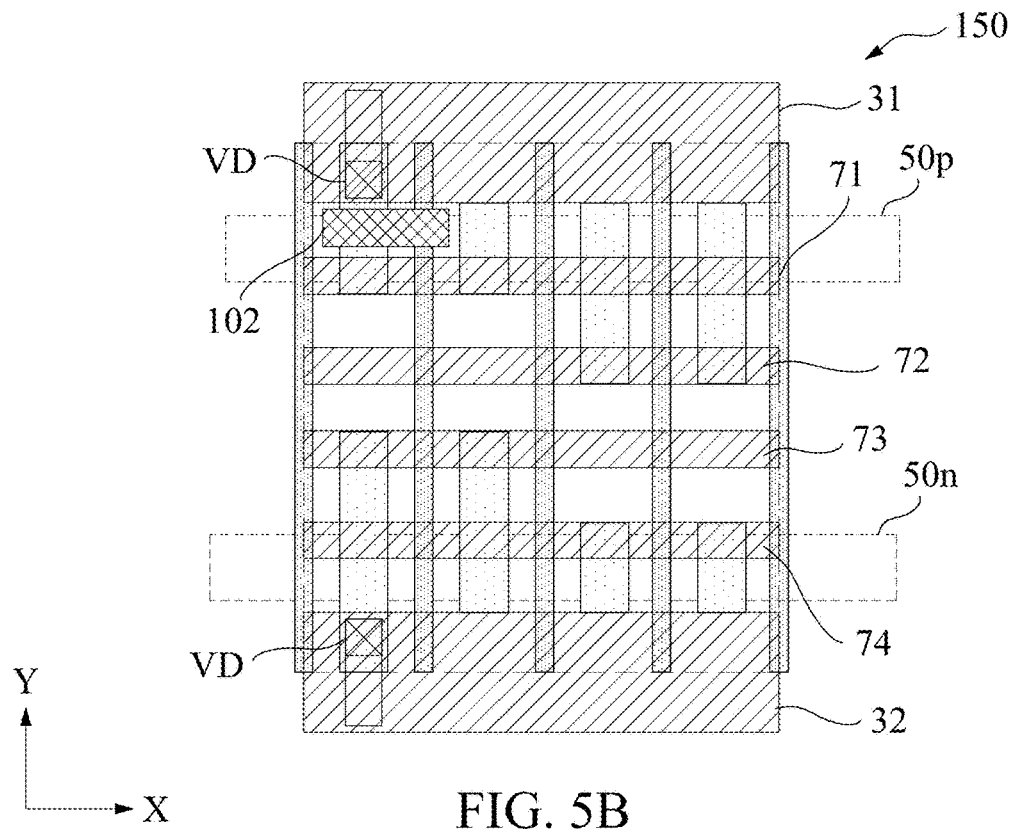

FIGS. 5A-5B are schematic diagrams of a layout design of a semiconductor cell structure 150 that is a modification of the semiconductor cell structure 100 in FIGS. 1A-1B, in accordance with some embodiments. The layout of the active zones (e.g., 50$p$ and 50$n$), the gate strips (e.g., 42 and 44), the conductive segments (e.g., 61-68), and the dummy gate-strips (e.g., 41, 49, and 45) are the same in FIGS. 5A-5B and FIGS. 1A-1B. The layout of the conducting element 102 in FIGS. 5A-5B, however, is different from the layout of the conducting element 102 in FIGS. 1A-1B. In FIGS. 5A-5B, the conducting element 102 conductively connects the first gate-strip 42 with the conductive segment 61. When the conductive segment 61 is conductively connected to the power rail 31 through one of the vias VD and the power rail 31 is held at the upper supply voltage VDD, the channel region 42$n$ of the transistor T2$n$ remains turned on by the upper supply voltage VDD applied to the gate of the transistor T2$n$.

In some embodiments, the gate-strip 44 in FIGS. 1A-1B or FIGS. 5A-5B) includes a first gate-strip segment intersecting the p-type active zone 50$p$ over the channel region 44$p$ and a second gate-strip segment intersecting the n-type active zone 50$n$ over the channel region 44$n$. In some embodiments, the first gate-strip segment and the second gate-strip segment are conductively disconnected (such as separated by a gap) in the Y-direction in forming the gate-strip 44. In some embodiments, the first gate-strip segment and the second gate-strip segment are continuously joined in forming the second gate-strip 44.

In some embodiments, one or more of the dummy gate-strips (e.g., 41, 45, and 49) in FIGS. 1A-1B, FIG. 3C, or FIGS. 5A-5B are formed by two dummy gate-strip segments. In some embodiments, each of the dummy gate-strip 41, the dummy gate-strip 45, and the dummy gate-strip 49 include a first dummy gate-strip segment intersecting the p-type active zone 50$p$ and a second dummy gate-strip segment intersecting the n-type active zone 50$n$. In some embodiments, the first dummy gate-strip segment and the second dummy gate-strip segment are conductively disconnected (such as separated by a gap) in the Y-direction. In some embodiments, the first dummy gate-strip segment and the second dummy gate-strip segment are continuously joined.

Figure 6A:
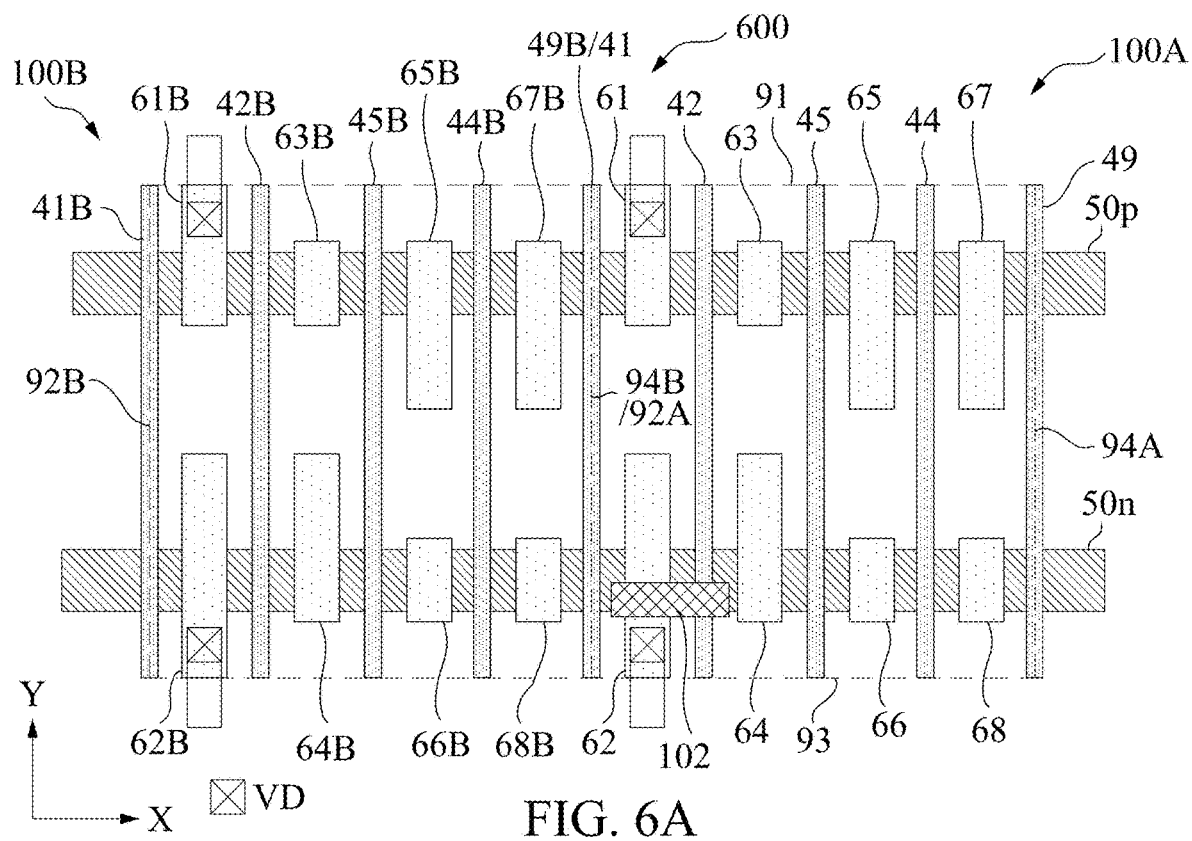
FIGS. 6A-6B are schematic diagrams of a layout design of an integrated circuit having two engineering change order cell structures abutting each other, in accordance with some embodiments.
Figure 6B:
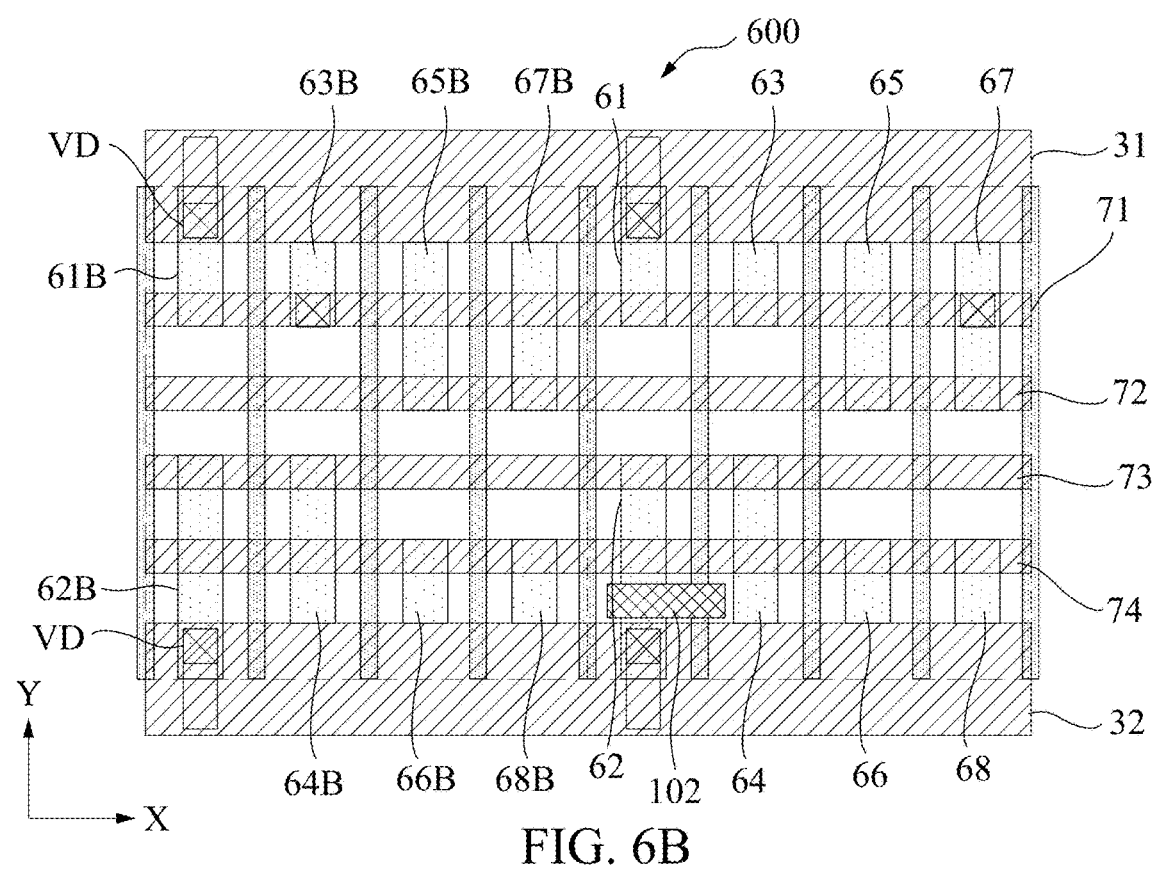

FIGS. 6A-6B are schematic diagrams of a layout design of an integrated circuit 600 having two engineering change order cell structures (ECO cell structures) 100A and 100B abutting each other, in accordance with some embodiments. In some embodiments, the layout of the ECO cell structure 100A in the integrated circuit 600 of FIGS. 6A-6B is the same as the layout of the semiconductor cell structure 100 in FIGS. 1A-1B. In some embodiments, the layout of the ECO cell structure 100A in the integrated circuit 600 of FIGS. 6A-6B is the same as the layout of the semiconductor cell structure 150 in FIGS. 5A-5B. In the schematic diagram of the layout of the integrated circuit 600 in FIG. 6A, the layout of the ECO cell structure 100B in the integrated circuit 600 of FIGS. 6A-6B is a modification of the layout of the semiconductor cell structure 100 in FIGS. 1A-1B. The ECO cell structure 100B includes the gate strips (e.g., 42B and 44B), the conductive segments (e.g., 61B-68B), and the dummy gate-strips (e.g., 41B, 49B, and 45B). The conductive segments 61B and 62B are correspondingly connected to the power rails 31 and 33 through the vias VD. In the layout of the ECO cell structure 100B, however, the conducting element 102 in FIGS. 1A-1B is not implemented in the ECO cell structure 100B to conductively connect the first gate-strip 42B to the conductive segment 62B.

In some embodiments, as shown in FIG. 6B, the integrated circuit 600 includes power rails (e.g., 31 and 32) and horizontal routing lines (e.g., 71-74) extending in the X-direction. In some embodiments, both the power rails (e.g., 31 and 32) and the horizontal routing lines (e.g., 71-74) are fabricated in the first metal layer M0. In FIG. 6B, the horizontal routing line 74 intersects eight conductive segments (e.g., 62B, 64B, 66B, 68B, 62, 64, 66, and 68) without making direct conductive contacts with the underneath conductive segments through via connections at the intersections. The horizontal routing line 73 intersects four conductive segments (e.g., 62B, 64B, 62 and 64) without making direct conductive contacts with the underneath conductive segments through via connections at the intersections. The horizontal routing line 72 intersects four conductive segments (e.g., 65B, 67B, 65, and 67) without making direct conductive contacts with the underneath conductive segments through via connections at the intersections.

In some embodiments, as shown in FIG. 6B, the horizontal routing line 71 intersects eight conductive segments (e.g., 61B, 63B, 65B, 67B, 61, 63, 65, and 67) in the two ECO cell structures 100A and 100B. While the horizontal routing line 71 does not form direct conductive contacts though vias with six of the eight underneath conductive segments (e.g., 61B, 65B, 67B, 61, 63, and 65), the horizontal routing line 71 is conductively connected to the conductive segments 63B and 67 through vias VD at the intersections. In some embodiments, design rules impose restrictions on via connections between the horizontal routing lines and the conductive segments. For example, in some embodiments, when the horizontal routing line 71 has no via connections with six of the eight underneath conductive segments (e.g., 61B, 65B, 67B, 61, 63, and 65) in the two ECO cell structures 100A and 100B, via connections from the horizontal routing line 71 to the other two underneath conductive segments 63B and 67 at the intersections are deemed as point connection failure by some implementations of design rules, if none of the transistors in the two ECO cell structures 100A and 100B are configured to be at an always-on state. In FIGS. 6A-6B, however, there is no point connection failure due to the via connections from the horizontal routing line 71 to the underneath conductive segments 63B and 67 at the intersections, because are the transistor T1$p$ is configured to be at an always-on state and the channel region 42$p$ (in the p-type active zone 50$p$) under the first gate-strip 42 is configured to be conductive by applying the lower supply voltage VSS to the gate of the transistor T1$p$.

Figure 6C:
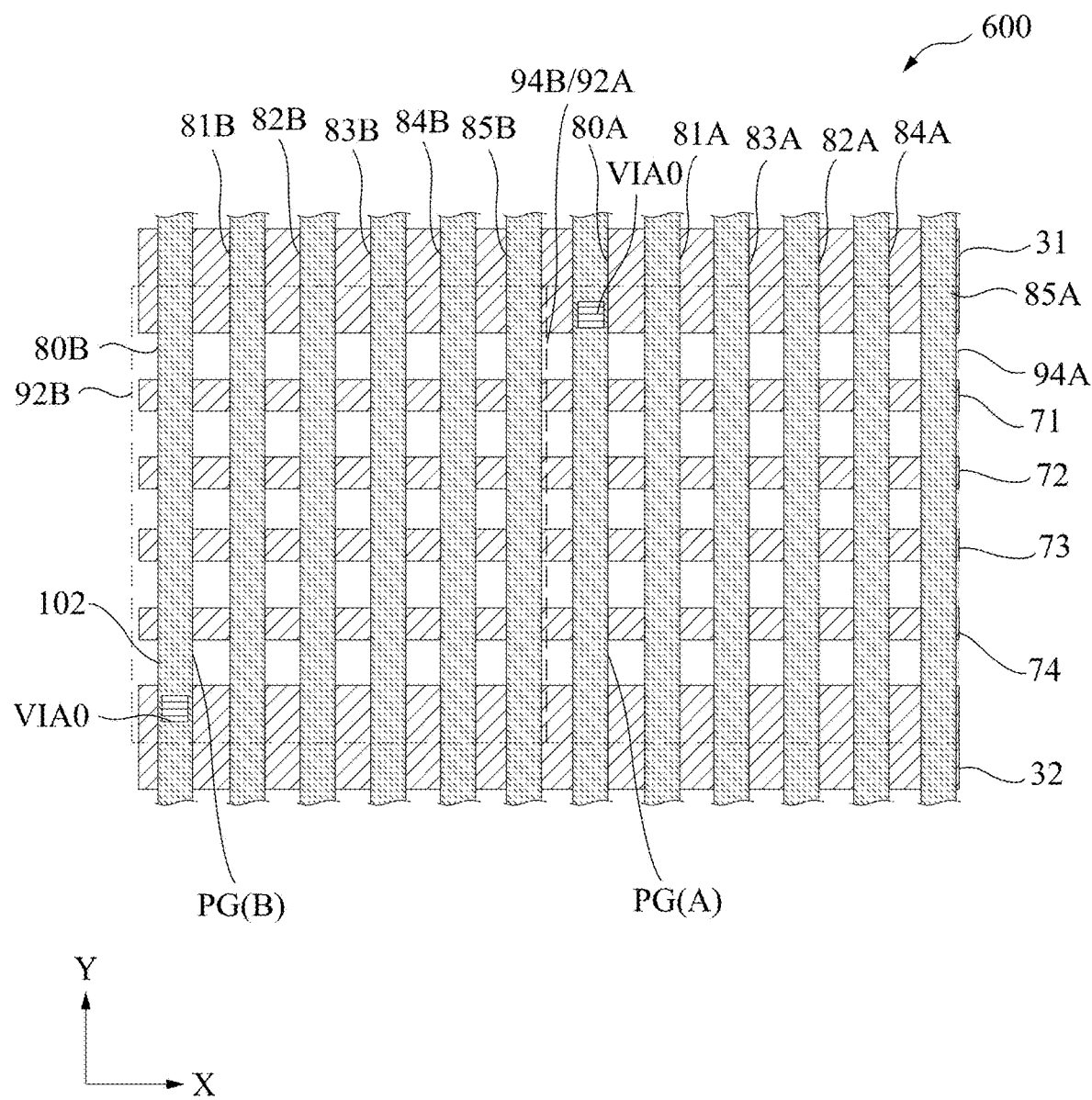
FIG. 6C is a schematic diagram of a layout design of horizontal conducting lines and vertical conducting lines for the integrated circuit in FIGS. 6A-6B, in accordance with some embodiments.

In some embodiments, the supply voltages are conducted to the power rails (e.g., 31 and 32) in FIG. 6B through vertical power conducting lines in a second metal layer M1 overlying a dielectric insulation layer above the first metal layer M0. FIG. 6C is a schematic diagram of a layout design of horizontal conducting lines in the first metal layer M0 and vertical conducting lines in the second metal layer M1 for the integrated circuit 600 in FIGS. 6A-6B, in accordance with some embodiments. Vertical conducting lines 80A-85A and vertical conducting lines 80B-85B are all extending in the Y-direction. In FIG. 6C, the vertical conducting lines 80A-85A cross over the ECO cell structure 100A between the vertical boundaries 92A and 94A, and the vertical conducting lines 80B-85B cross over the ECO cell structure 100B between the vertical boundaries 92B and 94B. In some embodiments, the vertical conducting lines 81A-85A and 81B-85B are used as vertical routing lines for intra-cell or inter-cell conductive connections, while the vertical conducting lines 80A and 80B are used as vertical power conducting lines PG(A) and PG(B) for conducting the supply voltages to the power rails (e.g., 31 and 32).

In some embodiments, each of the vertical conducting lines 80A and 80B in the second metal layer M1 are conductively connected to one of the power rails 31 and 32 in the first metal layer M0 through one of the vias VIA0 between the second metal layer M1 and the first metal layer M0. In one example, the vertical conducting lines 80A conducts the upper supply voltage VDD to the power rail 31, and the vertical conducting lines 80B conducts the lower supply voltage VSS to the power rail 32. In another example, the vertical conducting lines 80A conducts the lower supply voltage VSS to the power rail 32, and the vertical conducting lines 80B conducts the upper supply voltage VDD to the power rail 31. In still another example, both the vertical conducting lines 80A and the vertical conducting lines 80B conduct the upper supply voltage VDD to the power rail 31, and additional vertical conducting lines crossing over other cells (not shown in the figure) are used as the vertical power conducting lines for conducting the lower supply voltage VSS to the power rail 32.

In FIGS. 6A-6B, each of the ECO cell structures 100A and 100B has a smaller cell width than some other layout designs of ECO cell structures. The cell width of the ECO cell structure 100A or 100B is identical to the cell width of the semiconductor cell structure 100 in FIGS. 1A-1B. In FIGS. 1A-1B, the pitch distance from the gate strip 42 to the dummy gate-strip 41 is identical to the pitch distance from the gate strip 42 to the dummy gate-strip 45, and the pitch distance from the gate strip 44 to the dummy gate-strip 49 is identical to the pitch distance from the gate strip 44 to the dummy gate-strip 45. The pitch distance from the dummy gate-strip 45 to the gate strip 42 is identical to the pitch distance from the dummy gate-strip 45 to the gate strip 44. Thus, the dummy gate-strip 41, the gate-strip 42, the dummy gate-strip 45, the gate-strip 44, and the dummy gate-strip 49 are equally spaced with a same pitch distance, which is the Contact Poly Pitch (CPP) as shown in the figure. The cell width of the semiconductor cell structure 100 in FIGS. 1A-1B is 4 CPP.

In FIG. 6C, twelve vertical conducting lines 80A-85A and 80B-85B are uniformly placed within a horizontal span of two cell widths, a total span of 8 CPP. The metal-to-metal pitch distance in the second metal layer M1 is two thirds of a CPP (because 8 CPP divided by 12 lines is ⅔ CPP). In FIG. 6C, every six vertical conducting lines has one vertical conducting line configured as a vertical power conducting line. For example, for the vertical conducting lines 80A-85A, the vertical conducting line 80A is configured as the vertical power conducting line PG(A). For the vertical conducting lines 80B-85B, the vertical conducting line 80B is configured as the vertical power conducting line PG(B). This layout design of the vertical conducting lines has better electromigration (EM) and voltage drop (IR) performance than an alternative layout design based on base cell structures each having a cell width of 6 CPP. In some embodiments, in the alternative layout design when the base cell width is 6 CPP, if the metal-to-metal pitch distance in the second metal layer M1 remains at ⅔ CPP, then, every nine vertical conducting lines has one vertical conducting line configured as a vertical power conducting line (because 6 CPP divided by 9 is ⅔ CPP). The layout design of configuring one vertical power conducting line for every six vertical conducting lines as shown in FIG. 6C is an improvement for some EM/IR performance measurement, as compared with the alternative layout design of configuring one vertical power conducting line for every nine vertical conducting lines.

During the initial design of an integrated circuit, in some embodiments, the ECO cells such as the ECO cell structures 100A and 100B in FIG. 6A-6B are distributed in the layout plan. In some embodiments, the ECO cells such as the ECO cell structure 100 in FIG. 1A-1B or FIG. 5A-5B are also distributed in the layout plan. During the initial design of an integrated circuit, the ECO cells are not functionally connected to other normal functioning electronic components. During design modifications, one or more horizontal routing lines (e.g., 71-74) are selectively connected to the gate-strips and the conductive segments in the ECO cell structures (e.g., 100A, and 100B), and one or more vertical conducting lines (e.g., 81A-85A and 81B-85B) are selectively connected to the horizontal routing lines (e.g., 71-74). At least some ECO cells are changed into functional logic cells by the newly created conductive connections between the electronic elements in the ECO cell structures 100A and 100B, based on the horizontal routing lines (e.g., 71-74) and vertical conducting lines (e.g., 81A-85A and 81B-85B). The newly created functional logic cells are connected to other normal functioning electronic components through the horizontal routing lines (e.g., 71-74) and the vertical conducting lines (e.g., 81A-85A and 81B-85B).

In some embodiments, each of the four transistors in the ECO cell structure 100B of FIG. 6A-6B are used to perform design functions in some of the newly created functional logic cells during design modifications. In some embodiments, the n-type transistor having the gate under the gate-strip 44 and the two p-type transistors in the ECO cell structure 100A of FIG. 6A-6B are used to perform design functions in some of the newly created functional logic cells during design modifications. In some embodiments, each of the four transistors in the ECO cell structure 100A of FIG. 6A-6B are used to perform design functions in some of the newly created functional logic cells during design modifications, after a part of the conducting element of the conducting element 102 is removed to conductively isolate the gate-strip 42 from the second conductive segment 62 within the ECO cell structure 100A.

Figure 7:
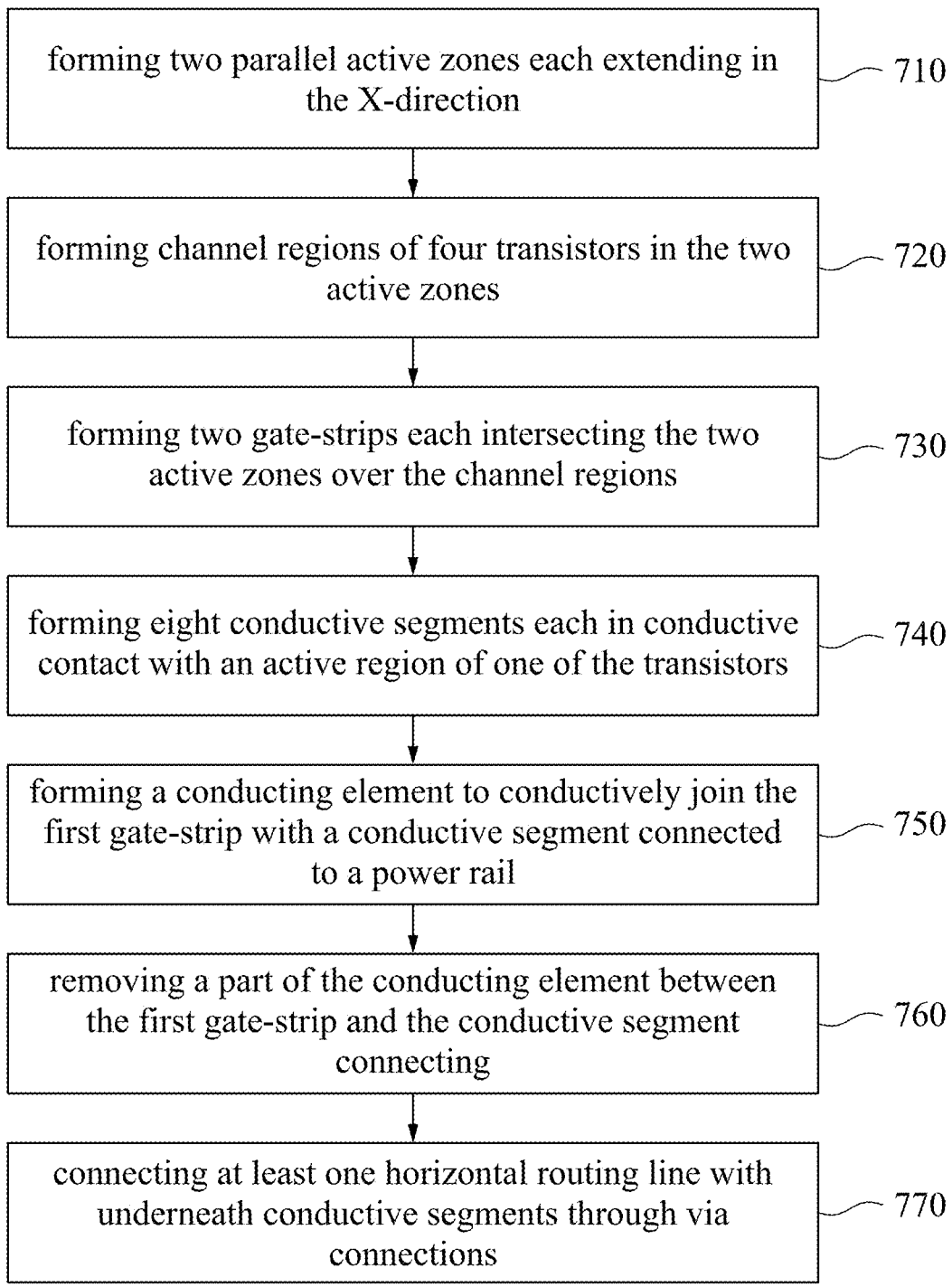
FIG. 7 is a flowchart of a process of generating a set of masks for fabricating a semiconductor cell structure by modifying an ECO cell structure, in accordance with some embodiments.

FIG. 7 is a flowchart of a process 700 of generating a set of masks for fabricating a semiconductor cell structure by modifying an ECO cell structure, in accordance with some embodiments. The process 700 includes blocks 710-770. At block 710, two parallel active zones each extending in the X-direction are formed. One of the two parallel active zones is a p-type active zone, and the other one of the two parallel active zones is an n-type active zone.

At block 720, channel regions of four transistors are formed in the two active zones. In some embodiments, as shown in FIGS. 2A-2B, a first channel region 42p between two active regions (e.g., 61p and 63p) of a first transistor T1p is formed in the p-type active zone 50p, a second channel region 42n between two active regions (e.g., 62n and 64n) of a second transistor T2n is formed in the n-type active zone 50n, a third channel region 44p between two active regions (e.g., 65p and 6'7p) of a third transistor T3p is formed in the p-type active zone 50p, and a fourth channel region 44n between two active regions (e.g., 66n and 68n) of a fourth transistor T4n is formed in the n-type active zone 50n.

At block 730, two gate-strips each extending in the Y-direction is formed, and each of the two gate-strips intersects the two active zones over the channel regions. In some embodiments, as shown in FIG. 1A and FIGS. 2A-2B, the gate-strip 42 intersects the p-type active zone 50p over the first channel region 42p and intersects the n-type active zone 50n over the second channel region 42n; the gate-strip 44 intersects the p-type active zone 50p over the third channel region 44p and intersects the n-type active zone 50n over the fourth channel region 44n.

At block 740, eight conductive segments extending in the Y-direction are formed and each conductive segment is in conductive contact with an active region of one of the transistors. In some embodiments, as shown in FIG. 1A and FIGS. 2A-2B, each conductive segment in a first pair (e.g., 61 and 63) is in conductive contact with a corresponding active region (e.g., 61p and 63p) of the first transistor T1p; each conductive segment in a second pair (e.g., 62 and 64) is in conductive contact with a corresponding active region (e.g., 62n and 64n) of the second transistor T2n; each conductive segment in a third pair (e.g., 65 and 67) is in conductive contact with a corresponding active region (e.g., 65p and 6'7p) of the third transistor T3p; and each conductive segment in a fourth pair (e.g., 66 and 68) is in conductive contact with a corresponding active region (e.g., 66n and 68n) of the fourth transistor T4n.

At block 750, a conducting element is formed to conductively join the first gate-strip with a conductive segment connected to a power rail. In some embodiments, as shown in FIG. 1A and FIG. 2B, the conducting element 102 conductively connects the first gate-strip 42 with the conductive segment 62 that is conductively connected to the power rail 31.

At block 760, a part of the conducting element between the first gate-strip and the second conductive segment is removed. In some embodiments, the mask pattern in a mask of the early generation is modified to form a mask of a later generation, specifying a disconnection of the conducting element between the first gate-strip and the second conductive segment. In the example as shown in FIGS. 8A-8B, after a part 102G of the conducting element 102 is removed, the direct conductive connection between the first gate-strip 42 and the conductive segment 62 is broken.

At block 770, horizontal routing lines extending in the X-direction are formed and direct conductive connections between selected horizontal routing lines and underneath conductive segments are formed through via connections. In some embodiments, the ECO cell structure 100 in FIG. 1A is changed into functional logic cell, after the changing of the conductive connections between the horizontal routing lines and underneath conductive segments and the changing of the conductive connections between the horizontal routing lines and additional vertical routing lines.

Figure 8A:
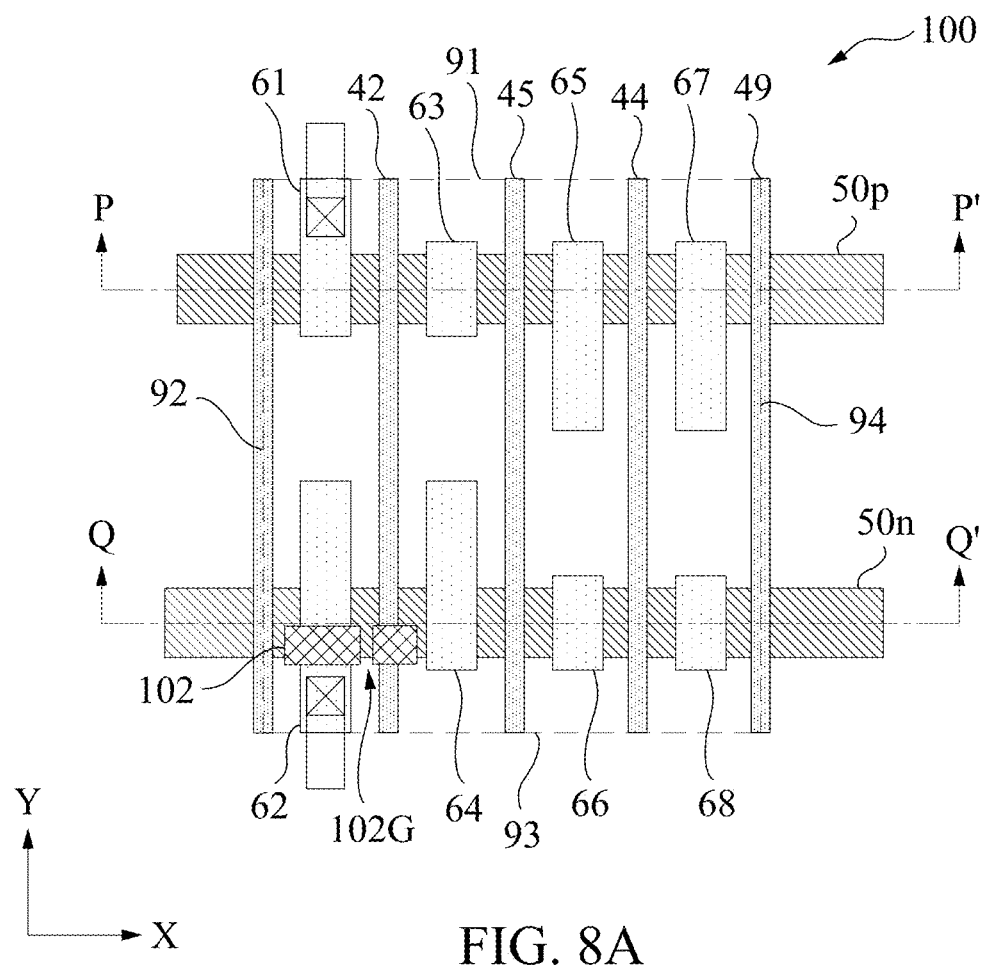
FIG. 8A is a schematic diagram of a layout design of a modified semiconductor cell structure after removing a part of a conducting element in the semiconductor cell structure of FIG. 1A, in accordance with some embodiments.
Figure 8B:
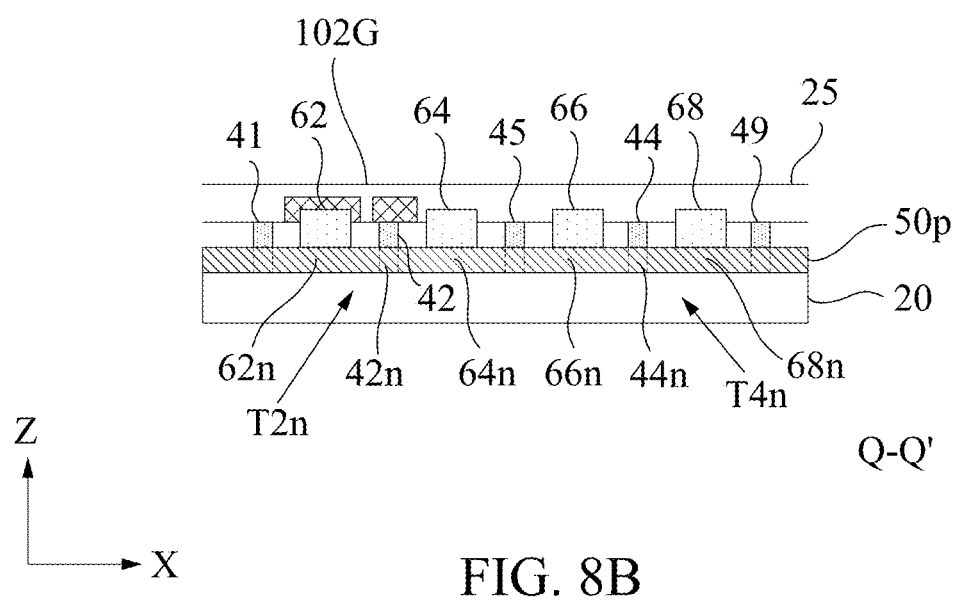
FIG. 8B is a cross-sectional view of the modified semiconductor cell structure in FIG. 8A along cutting plane Q-Q', in accordance with some embodiments.

FIG. 8A is a schematic diagram of a layout design of a modified semiconductor cell structure after removing a part of a conducting element in the semiconductor cell structure of FIG. 1A, in accordance with some embodiments. FIG. 8B is a cross-sectional view of the modified semiconductor cell structure in FIG. 8A along cutting plane Q-Q', in accordance with some embodiments. After the semiconductor cell structure of FIG. 1A is modified, in the layout design of FIG. 8A, the first gate-strip 42 and the conductive segment 62 is not directed connected, and the modified semiconductor cell structure in FIG. 8A includes two p-type transistors and two n-type transistors. In some embodiments, the p-type transistors and two n-type transistors in FIG. 8A are further connected to form a functional circuit, such as, a logic gate circuit. In general, in an earlier stage of the layout design for an integrated circuit, there are many ECO cells (each has cell structure of FIG. 1A) distributed in a floor plan. In some later stage of the layout design for the integrated circuit, some of the ECO cells are modified and converted to functional circuits. In some modified ECO cells as show in FIG. 8A, the first gate-strip 42 and the conductive segment 62 is not directed connected.

Figure 9:
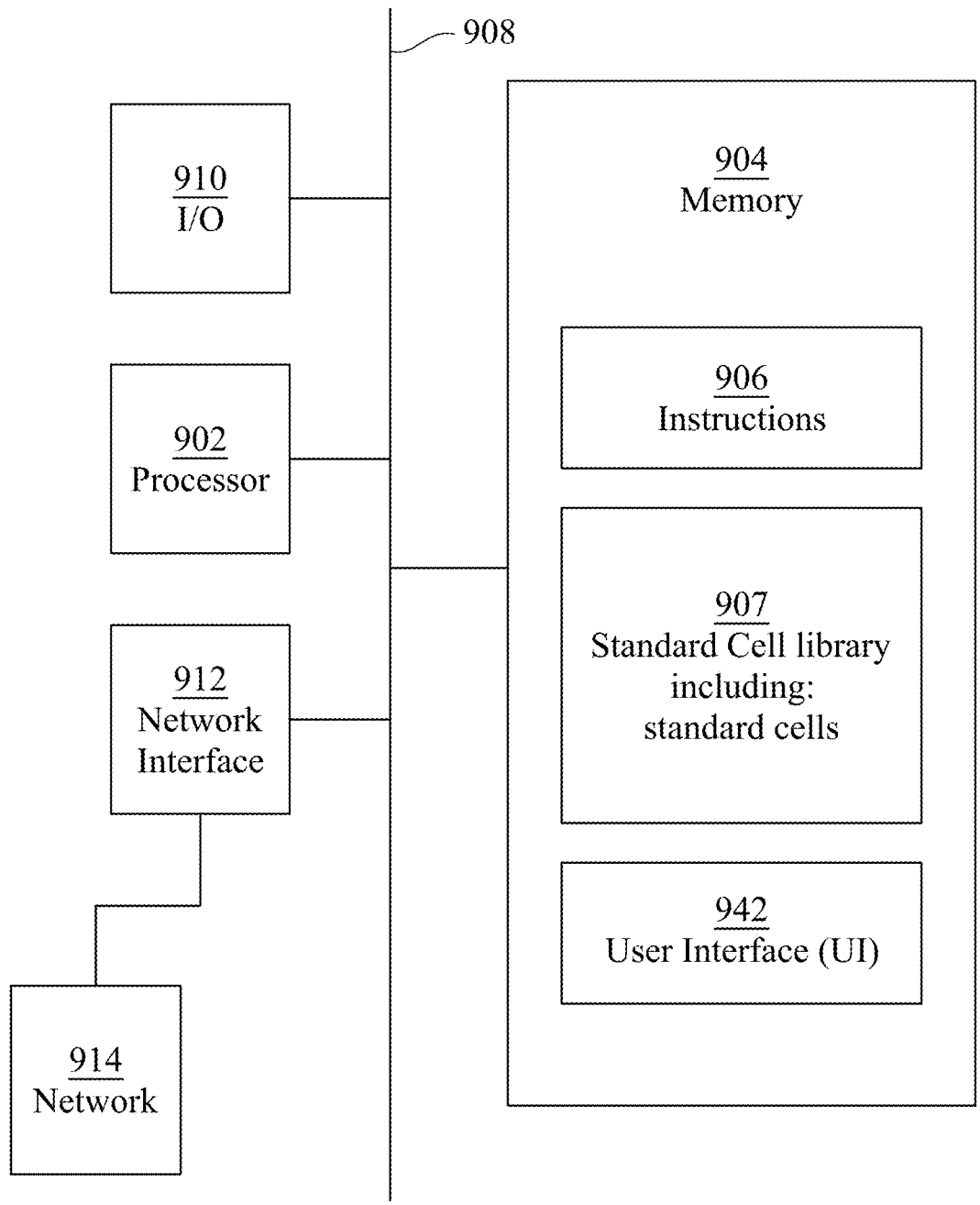
FIG. 9 is a block diagram of an electronic design automation (EDA) system in accordance with some embodiments.

FIG. 9 is a block diagram of an electronic design automation (EDA) system 900 in accordance with some embodiments.

In some embodiments, EDA system 900 includes an APR system. Methods described herein of designing layout diagrams represent wire routing arrangements, in accordance with one or more embodiments, are implementable, for example, using EDA system 900, in accordance with some embodiments.

In some embodiments, EDA system 900 is a general purpose computing device including a hardware processor 902 and a non-transitory, computer-readable storage medium 904. Storage medium 904, amongst other things, is encoded with, i.e., stores, computer program code 906, i.e., a set of executable instructions. Execution of instructions 906 by hardware processor 902 represents (at least in part) an EDA tool which implements a portion or all of the methods described herein in accordance with one or more embodiments (hereinafter, the noted processes and/or methods).

Processor 902 is electrically coupled to computer-readable storage medium 904 via a bus 908. Processor 902 is also electrically coupled to an I/O interface 910 by bus 908. A network interface 912 is also electrically connected to processor 902 via bus 908. Network interface 912 is connected to a network 914, so that processor 902 and computer-readable storage medium 904 are capable of connecting to external elements via network 914. Processor 902 is configured to execute computer program code 906 encoded in computer-readable storage medium 904 in order to cause system 900 to be usable for performing a portion or all of the noted processes and/or methods. In one or more embodiments, processor 902 is a central processing unit (CPU), a multi-processor, a distributed processing system, an application specific integrated circuit (ASIC), and/or a suitable processing unit.

In one or more embodiments, computer-readable storage medium 904 is an electronic, magnetic, optical, electromagnetic, infrared, and/or a semiconductor system (or apparatus or device). For example, computer-readable storage medium 904 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 904 includes a compact disk-read only memory (CD-ROM), a compact disk-read/write (CD-R/W), and/or a digital video disc (DVD).

In one or more embodiments, storage medium 904 stores computer program code 906 configured to cause system 900 (where such execution represents (at least in part) the EDA tool) to be usable for performing a portion or all of the noted processes and/or methods. In one or more embodiments, storage medium 904 also stores information which facilitates performing a portion or all of the noted processes and/or methods. In one or more embodiments, storage medium 904 stores library 907 of standard cells including such standard cells as disclosed herein.

EDA system 900 includes I/O interface 910. I/O interface 910 is coupled to external circuitry. In one or more embodiments, I/O interface 910 includes a keyboard, keypad, mouse, trackball, trackpad, touchscreen, and/or cursor direction keys for communicating information and commands to processor 902.

EDA system 900 also includes network interface 912 coupled to processor 902. Network interface 912 allows system 900 to communicate with network 914, to which one or more other computer systems are connected. Network interface 912 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 900.

System 900 is configured to receive information through I/O interface 910. The information received through I/O interface 910 includes one or more of instructions, data, design rules, libraries of standard cells, and/or other parameters for processing by processor 902. The information is transferred to processor 902 via bus 908. EDA system 900 is configured to receive information related to a UI through I/O interface 910. The information is stored in computer-readable medium 904 as user interface (UI) 942.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 900. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 10:
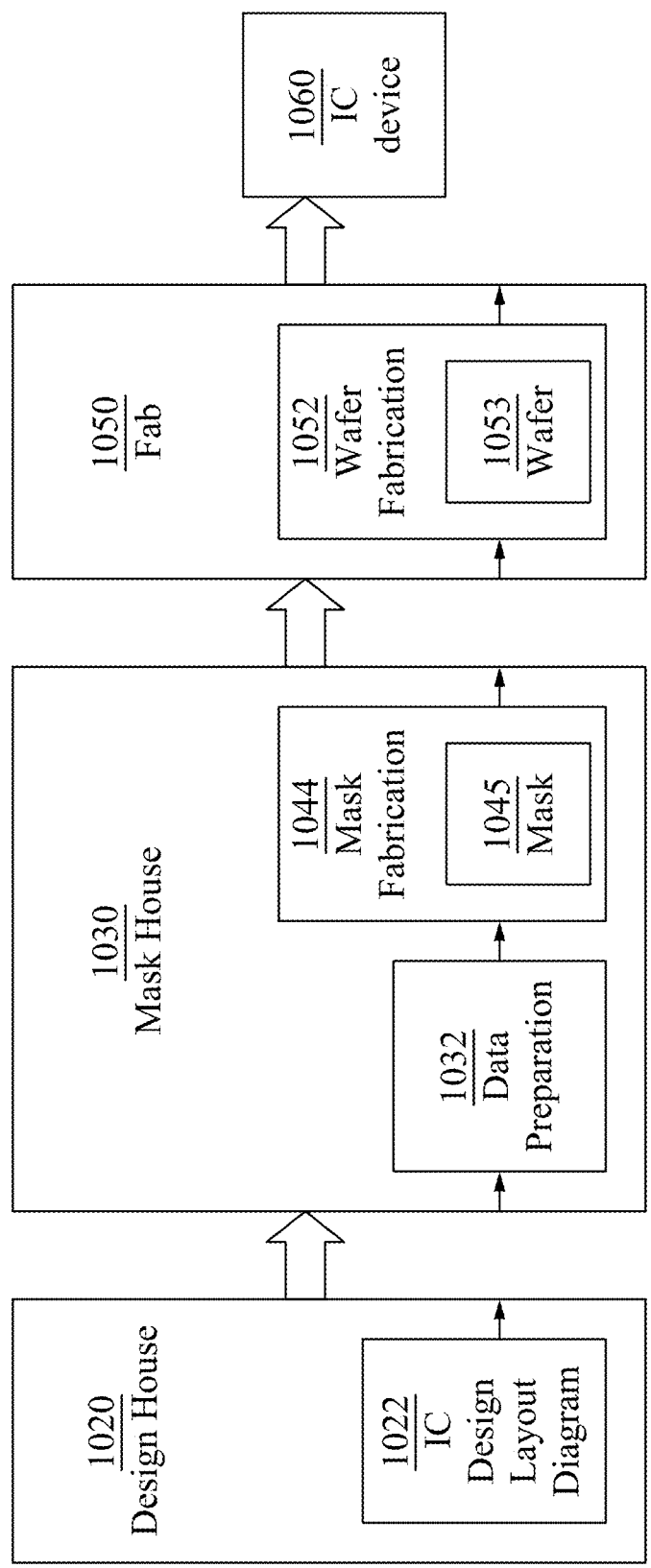
FIG. 10 is a block diagram of an integrated circuit (IC) manufacturing system, and an IC manufacturing flow associated therewith, in accordance with some embodiments.

FIG. 10 is a block diagram of an integrated circuit (IC) manufacturing system 1000, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1000.

In FIG. 10, IC manufacturing system 1000 includes entities, such as a design house 1020, a mask house 1030, and an IC manufacturer/fabricator ("fab") 1050, that interact with one another in the design, development, and manufacturing cycles and/or services related to manufacturing an IC device 1060. The entities in system 1000 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1020, mask house 1030, and IC fab 1050 is owned by a single larger company. In some embodiments, two or more of design house 1020, mask house 1030, and IC fab 1050 coexist in a common facility and use common resources.

Design house (or design team) 1020 generates an IC design layout diagram 1022. IC design layout diagram 1022 includes various geometrical patterns designed for an IC device 1060. The geometrical patterns correspond to patterns of metal, oxide, or semiconductor layers that make up the various components of IC device 1060 to be fabricated. The various layers combine to form various IC features. For example, a portion of IC design layout diagram 1022 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1020 implements a proper design procedure to form IC design layout diagram 1022. The design procedure includes one or more of logic design, physical design or place and route. IC design layout diagram 1022 is presented in one or more data files having information of the geometrical patterns. For example, IC design layout diagram 1022 can be expressed in a GDSII file format or DFII file format.

Mask house 1030 includes data preparation 1032 and mask fabrication 1044. Mask house 1030 uses IC design layout diagram 1022 to manufacture one or more masks 1045 to be used for fabricating the various layers of IC device 1060 according to IC design layout diagram 1022. Mask house 1030 performs mask data preparation 1032, where IC design layout diagram 1022 is translated into a representative data file ("RDF"). Mask data preparation 1032 provides the RDF to mask fabrication 1044. Mask fabrication 1044 includes a mask writer. A mask writer converts the RDF to an image on a substrate, such as a mask (reticle) 1045 or a semiconductor wafer 1053. The design layout diagram 1022 is manipulated by mask data preparation 1032 to comply with particular characteristics of the mask writer and/or requirements of IC fab 1050. In FIG. 10, mask data preparation 1032 and mask fabrication 1044 are illustrated as separate elements. In some embodiments, mask data preparation 1032 and mask fabrication 1044 can be collectively referred to as mask data preparation.

In some embodiments, mask data preparation 1032 includes optical proximity correction (OPC) which uses lithography enhancement techniques to compensate for image errors, such as those that can arise from diffraction, interference, other process effects and the like. OPC adjusts IC design layout diagram 1022. In some embodiments, mask data preparation 1032 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1032 includes a mask rule checker (MRC) that checks the IC design layout diagram 1022 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1022 to compensate for limitations during mask fabrication 1044, which may undo part of the modifications performed by OPC in order to meet mask creation rules.

In some embodiments, mask data preparation 1032 includes lithography process checking (LPC) that simulates processing that will be implemented by IC fab 1050 to fabricate IC device 1060. LPC simulates this processing based on IC design layout diagram 1022 to create a simulated manufactured device, such as IC device 1060. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1022.

It should be understood that the above description of mask data preparation 1032 has been simplified for the purposes of clarity. In some embodiments, data preparation 1032 includes additional features such as a logic operation (LOP) to modify the IC design layout diagram 1022 according to manufacturing rules. Additionally, the processes applied to IC design layout diagram 1022 during data preparation 1032 may be executed in a variety of different orders.

After mask data preparation 1032 and during mask fabrication 1044, a mask 1045 or a group of masks 1045 are fabricated based on the modified IC design layout diagram 1022. In some embodiments, mask fabrication 1044 includes performing one or more lithographic exposures based on IC design layout diagram 1022. In some embodiments, an electron-beam (e-beam) or a mechanism of multiple e-beams is used to form a pattern on a mask (photomask or reticle) 1045 based on the modified IC design layout diagram 1022. Mask 1045 can be formed in various technologies. In some embodiments, mask 1045 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1045 includes a transparent substrate (e.g., fused quartz) and an opaque material (e.g., chromium) coated in the opaque regions of the binary mask. In another example, mask 1045 is formed using a phase shift technology. In a phase shift mask (PSM) version of mask 1045, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1044 is used in a variety of processes. For example, such a mask(s) is used in an ion implantation process to form various doped regions in semiconductor wafer 1053, in an etching process to form various etching regions in semiconductor wafer 1053, and/or in other suitable processes.

IC fab 1050 includes wafer fabrication 1052. IC fab 1050 is an IC fabrication business that includes one or more manufacturing facilities for the fabrication of a variety of different IC products. In some embodiments, IC Fab 1050 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1050 uses mask(s) 1045 fabricated by mask house 1030 to fabricate IC device 1060. Thus, IC fab 1050 at least indirectly uses IC design layout diagram 1022 to fabricate IC device 1060. In some embodiments, semiconductor wafer 1053 is fabricated by IC fab 1050 using mask(s) 1045 to form IC device 1060. In some embodiments, the IC fabrication includes performing one or more lithographic exposures based at least indirectly on IC design layout diagram 1022. Semiconductor wafer 1053 includes a silicon substrate or other proper substrate having material layers formed thereon. Semiconductor wafer 1053 further includes one or more of various doped regions, dielectric features, multilevel interconnects, and the like (formed at subsequent manufacturing steps).

Details regarding an integrated circuit (IC) manufacturing system (e.g., system 1000 of FIG. 10), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

One aspect of this description relates to a semiconductor cell structure. The semiconductor cell structure includes a first-type active zone and a second-type active zone each extending in a first direction that is perpendicular to a second direction. The semiconductor cell structure also includes a first pair of conductive segments intersecting the first-type active zone over active regions of a first transistor, a second pair of conductive segments intersecting the second-type active zone over active regions of a second transistor, a third pair of conductive segments each intersecting the first-type active zone over active regions of a third transistor, and a fourth pair of conductive segments each intersecting the second-type active zone over active regions of a fourth transistor. The first conductive segment in the first pair is configured to have a first supply voltage, and the second conductive segment in the second pair is configured to have a second supply voltage. The semiconductor cell structure further includes a first gate-strip and a second gate-strip, extending in the second direction. The first gate-strip intersects the first-type active zone over a first channel region of the first transistor and intersects the second-type active zone over a second channel region of the second transistor. The first gate-strip is conductively connected to the second conductive segment. The second gate-strip intersects the first-type active zone over a third channel region of the third transistor and intersects the second-type active zone over a fourth channel region of the fourth transistor. The semiconductor cell structure still includes a first dummy gate-strip and a second dummy gate-strip, extending in the second direction. The first dummy gate-strip separates from the first gate-strip by one Contact Poly Pitch (CPP) along the first direction. The second dummy gate-strip separates from the second gate-strip by one CPP along the first direction. The first gate-strip and the second gate-strip are separated from each other by two CPPs along the first direction, and wherein the first dummy gate-strip and the second dummy gate-strip are separated from each other by four CPPs along the first direction.

Another aspect of this description relates to an integrated circuit. The integrated circuit includes a first-type active zone and a second-type active zone each extending in a first direction that is perpendicular to a second direction, and two engineering change order (ECO) cell structures abutting each other each other at a middle dummy gate-strip. Each of the two ECO cell structures includes a first gate-strip and a second gate-strip each extending in the second direction. The first gate-strip conductively connects a gate of a first transistor with a gate of a second transistor, and the second gate-strip conductively connects a gate of a third transistor with a gate of a fourth transistor. The first gate-strip and the second gate-strip are separated from each other by two CPPs along the first direction. Each of the two ECO cell structures also includes a side dummy gate-strip extending in the second direction and a plurality of conductive segments each extending in the second direction. The side dummy gate-strip separates from the middle dummy gate-strip by four CPPs along the first direction. The first gate-strip and the second gate-strip are between the side dummy gate-strip and the middle dummy gate-strip. Among the plurality of conductive segments, a first conductive segment is in conductive contact with an active region of the first transistor, and a second conductive segment is in conductive contact with an active region of the second transistor. The first conductive segment is configured to have a first supply voltage and the second conductive segment is configured to have a second supply voltage. The integrated circuit further includes a conducting element conductively joining the first gate-strip with the second conductive segment in one of the of the two ECO cell structures.

Still another aspect of this description relates to a method of generating a set of masks for fabricating a semiconductor cell structure. The method includes forming a first channel region between two active regions of a first transistor in a first-type active zone extending in a first direction, a second channel region between two active regions of a second transistor in a second-type active zone, a third channel region between two active regions of a third transistor in the first-type active zone, and a fourth channel region between two active regions of a fourth transistor in the second-type active zone. The method also includes forming a first gate-strip, a second gate-strip, a first dummy gate-strip and a second dummy gate-strip. The first gate-strip intersects the first-type active zone over the first channel region and intersects the second-type active zone over the second channel region. The second gate-strip intersects the first-type active zone over the third channel region and intersects the second-type active zone over the fourth channel region. The first gate-strip and the second gate-strip are separated from each other by two CPPs along the first direction. The first dummy gate-strip and the second dummy gate-strip are separated from each other by four CPPs along the first direction. The method further includes forming four pairs of conductive segments each extending in a second direction. Each of the four pairs of conductive segments is associated with a corresponding transistor and includes two conductive segments each conductively contacting one of the two active regions of the corresponding transistor. Among the conductive segments, a first conductive segment in a first pair is configured to have a first supply voltage and a second conductive segment in a second pair is configured to have a second supply voltage. The method still includes forming a mask pattern, in a mask of an early generation, specifying a conducting element conductively joining the first gate-strip with the second conductive segment, and modifying the mask pattern in the mask of the early generation, to form a mask of a later generation, which specifies a disconnection of the conducting element between the first gate-strip and the second conductive segment.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A semiconductor cell structure comprising:
   a first-type active zone and a second-type active zone each extending in a first direction that is perpendicular to a second direction;
   a first pair of conductive segments intersecting the first-type active zone over active regions of a first transistor, a first conductive segment in the first pair being configured to have a first supply voltage;
   a second pair of conductive segments intersecting the second-type active zone over active regions of a second transistor, a second conductive segment in the second pair being configured to have a second supply voltage;
   a third pair of conductive segments each intersecting the first-type active zone over active regions of a third transistor;
   a fourth pair of conductive segments each intersecting the second-type active zone over active regions of a fourth transistor;
   a first gate-strip, extending in the second direction, intersecting the first-type active zone over a first channel region of the first transistor and intersecting the second-type active zone over a second channel region of the second transistor, wherein the first gate-strip is conductively connected to the second conductive segment;
   a second gate-strip, extending in the second direction, intersecting the first-type active zone over a third channel region of the third transistor and intersecting the second-type active zone over a fourth channel region of the fourth transistor;
   a first dummy gate-strip extending in the second direction and separated from the first gate-strip by one Contact Poly Pitch (CPP) along the first direction;
   a second dummy gate-strip extending in the second direction and separated from the second gate-strip by one CPP along the first direction; and
   wherein the first gate-strip and the second gate-strip are separated from each other by two CPPs along the first direction, and wherein the first dummy gate-strip and the second dummy gate-strip are separated from each other by four CPPs along the first direction.

2. The semiconductor cell structure of claim 1, further comprising:
   a first metal layer that overlies an interlayer dielectric layer covering the first gate-strip, the second gate-strip, and the conductive segments.

3. The semiconductor cell structure of claim 2, further comprising:
   a plurality of horizontal routing lines extending in the first direction in the first metal layer, wherein a horizontal routing line intersecting one or more conductive segments in conductive segments over one or more corresponding intersections.

4. The semiconductor cell structure of claim 2, comprising:
   a first power conducting line, extending in the second direction, in a second metal layer overlying an interlayer dielectric layer above the first metal layer.

5. The semiconductor cell structure of claim 1, further comprising:
   a conducting element conductively joining the second conductive segment and the first gate-strip.

6. The semiconductor cell structure of claim 5, further comprising a first metal layer that overlies an interlayer dielectric layer covering the first gate-strip, the second gate-strip, and the conductive segments.

7. The semiconductor cell structure of claim 1, wherein the second gate-strip includes a first gate-strip segment intersecting the first-type active zone over the third channel region and a second gate-strip segment intersecting the second-type active zone over the fourth channel region.

8. The semiconductor cell structure of claim 7, wherein the first gate-strip segment and the second gate-strip segment are conductively joined in forming the second gate-strip.

9. The semiconductor cell structure of claim 1, further comprising:
   a third dummy gate-strip, extending in the second direction between the first gate-strip and the second gate-strip, located at a middle line having a same distance to each of the first dummy gate-strip and the second dummy gate-strip.

10. The semiconductor cell structure of claim 9, wherein the first dummy gate-strip, the first gate-strip, the third dummy gate-strip, the second gate-strip, and the second dummy gate-strip are equally spaced with a same pitch distance.

11. The semiconductor cell structure of claim 9, wherein each of the first dummy gate-strip, the second dummy gate-strip, and the third dummy gate-strip includes a first dummy gate-strip segment intersecting the first-type active zone and a second dummy gate-strip segment intersecting the second-type active zone.

12. The semiconductor cell structure of claim 9, wherein each of the first dummy gate-strip, the second dummy gate-strip, and the third dummy gate-strip intersects the first-type active zone over a first isolation region in the first-type active zone and the second-type active zone over a second isolation region in the second-type active zone.

13. An integrated circuit comprising:
a first-type active zone and a second-type active zone each extending in a first direction that is perpendicular to a second direction;
two engineering change order (ECO) cell structures abutting each other at a middle dummy gate-strip, each of the two ECO cell structures comprising,
a first gate-strip and a second gate-strip each extending in the second direction, the first gate-strip conductively connecting a gate of a first transistor with a gate of a second transistor, and the second gate-strip conductively connecting a gate of a third transistor with a gate of a fourth transistor, wherein the first gate-strip and the second gate-strip are separated from each other by two Contact Poly Pitches (CPPs) along the first direction,
a side dummy gate-strip extending in the second direction and separated from the middle dummy gate-strip by four CPPs along the first direction, wherein the first gate-strip and the second gate-strip are between the side dummy gate-strip and the middle dummy gate-strip, and
a plurality of conductive segments, each extending in the second direction, including a first conductive segment in conductive contact with an active region of the first transistor and a second conductive segment in conductive contact with an active region of the second transistor, wherein the first conductive segment is configured to have a first supply voltage and the second conductive segment is configured to have a second supply voltage; and
a conducting element conductively joining the first gate-strip with the second conductive segment in one of the of the two ECO cell structures.

14. The integrated circuit of claim 13, further comprising:
a first metal layer that overlies an interlayer dielectric layer covering the first gate-strip, the second gate-strip, and the plurality of conductive segments.

15. The integrated circuit of claim 14, further comprising:
at least one horizontal routing line extending in the first direction in the first metal layer, wherein the at least one horizontal routing line intersects one or more of the conductive segments in the two ECO cell structures over at one or more corresponding intersections.

16. The integrated circuit of claim 14, wherein the conducting element is in a middle layer underneath the first metal layer.

17. The integrated circuit of claim 14, comprising:
a first power conducting line and a second power conducting line, extending in the second direction, in a second metal layer, wherein the first power conducting line conductively connects the first conductive segment in a first one of the two ECO cell structures, and wherein the second power conducting line conductively connects either the first conductive segment or the second conductive segment in a second one of the two ECO cell structures.

18. A method of generating a set of masks for fabricating a semiconductor cell structure, the method comprising:
forming a first channel region between two active regions of a first transistor in a first-type active zone extending in a first direction, a second channel region between two active regions of a second transistor in a second-type active zone, a third channel region between two active regions of a third transistor in the first-type active zone, and a fourth channel region between two active regions of a fourth transistor in the second-type active zone;
forming a first gate-strip, a second gate-strip, a first dummy gate-strip and a second dummy gate-strip, wherein the first gate-strip intersects the first-type active zone over the first channel region and intersects the second-type active zone over the second channel region, wherein the second gate-strip intersects the first-type active zone over the third channel region and intersects the second-type active zone over the fourth channel region, wherein the first gate-strip and the second gate-strip are separated from each other by two Contact Poly Pitches (CPPs) along the first direction, and wherein the first dummy gate-strip and the second dummy gate-strip are separated from each other by four CPPs along the first direction;
forming four pairs of conductive segments each extending in a second direction, wherein each of the four pairs of conductive segments is associated with a corresponding transistor and includes two conductive segments each conductively contacting one of the two active regions of the corresponding transistor, and wherein a first conductive segment in a first pair is configured to have a first supply voltage and a second conductive segment in a second pair is configured to have a second supply voltage;
forming a mask pattern, in a mask of an early generation, specifying a conducting element conductively joining the first gate-strip with the second conductive segment; and
modifying the mask pattern in the mask of the early generation, to form a mask of a later generation, specifying a disconnection of the conducting element between the first gate-strip and the second conductive segment.

19. The method of claim 18, wherein the forming the conducting element joining the first gate-strip with the second conductive segment comprises:
forming the conducting element conductively in a middle layer underneath a first metal layer.

20. The method of claim 19, further comprising:
forming a first power conducting line, extending in the second direction, in a second metal layer, wherein the first power conducting line is conductively connected to the first conductive segment.

* * * * *